(12) United States Patent
Chan et al.

(10) Patent No.: US 7,199,036 B2
(45) Date of Patent: Apr. 3, 2007

(54) UNDER-BUMP METALLIZATION LAYERS AND ELECTROPLATED SOLDER BUMPING TECHNOLOGY FOR FLIP-CHIP

(75) Inventors: Chingho Philip Chan, Kowloon (HK); Guowei David Xiao, Kowloon (HK)

(73) Assignee: The Hong Kong University of Science and Technology, Clear Water Bay, Kowloon (HK)

( * ) Notice: Subject to any disclaimer, the term of this patent is extended or adjusted under 35 U.S.C. 154(b) by 110 days.

(21) Appl. No.: 10/854,174

(22) Filed: May 27, 2004

(65) Prior Publication Data

US 2005/0014355 A1    Jan. 20, 2005

(30) Foreign Application Priority Data

May 31, 2003    (CN) .................... 2003 1 0040656

(51) Int. Cl.
*H01L 21/44* (2006.01)
(52) U.S. Cl. ..................................... 438/613
(58) Field of Classification Search ........ 257/734–738; 438/613–618
See application file for complete search history.

(56) References Cited

U.S. PATENT DOCUMENTS 6,992,001 B1 *  1/2006  Lin ............................ 438/612
2002/0009869 A1    1/2002  Cotte et al.
2002/0036337 A1 *  3/2002  Yi et al. ..................... 257/613
2002/0079576 A1 *  6/2002  Seshan ........................ 257/737
2002/0185733 A1 * 12/2002  Chow et al. ................. 257/737
2003/0067073 A1    4/2003  Akram et al.
2003/0119300 A1 *  6/2003  Chiu et al. .................. 438/615
2003/0124833 A1 *  7/2003  Tong et al. .................. 438/613
2003/0199159 A1 * 10/2003  Fan et al. .................... 438/612
2003/0219966 A1 * 11/2003  Jin et al. ..................... 438/612
2003/0227079 A1 * 12/2003  Chia et al. ................... 257/723
2004/0088855 A1 *  5/2004  Akram ......................... 29/840
2004/0101993 A1 *  5/2004  Salmon ....................... 438/107
2004/0140475 A1 *  7/2004  Sun et al. .................... 257/100
2005/0170634 A1 *  8/2005  Lin ............................. 438/622

* cited by examiner

*Primary Examiner*—Nathan W. Ha
(74) *Attorney, Agent, or Firm*—Buchanan Ingersoll & Rooney, PC

(57) ABSTRACT

A series of improved processes and methods to manufacture solder bumps on the wafer which shrink the space among solder bumps and reduce the cost of manufacturing. A design method and a relevant manufacturing process are introduced to form an organic material or metal material layer, which is called a Bump-Reflow-Control Layer. The pad patterns can be defined by this method. A mechanical part is designed with a hermetic cover to improve the photoresist process. The series of photolithography process including the designing method of related photolithography mask is introduced to achieve the high quality and thick photoresist.

28 Claims, 9 Drawing Sheets

UNDER-BUMP METALLIZATION LAYERS AND ELECTROPLATED SOLDER BUMPING TECHNOLOGY FOR FLIP-CHIP

CROSS-REFERENCE TO RELATED APPLICATIONS

The present application claims priority of CN 03140656.4, which was filed in China on May 31, 2003, the entire contents of which is incorporated herein by reference.

FIELD OF THE INVENTION

The present invention relates to electronic packaging, microelectronics fabrication, and more particularly to solder bumps and under bump metallization pads on a wafer or a chip for flip chip attachment.

BACKGROUND OF THE INVENTION

Flip chip is an advanced semiconductor interconnection technology. It is also called as Controlled Collapse Chip Connection (C4) that a chip or die is flipped face down and bonded to the substrate with various interconnection materials. The technology is applicable to either single-chip packages or multiple-chip modules. In flip chip attachment, solder bumps deposited on a chip or die are used for electrical interconnection between a chip or an integrated circuit and a substrate. The substrate can be a silicon or ceramic or glass or printed circuit board (PCB) or some material composition substrate. When a chip or die with solder bumps is aligned to attach to a substrate, a reflow process of high temperature is performed to melt solder bumps. The solder bumps can form the solder joints to provide the electrical interconnection and the mechanical bonds between the chip and the substrate. There are many advantages that the flip chip provides, such as the shortest possible leads, lowest inductance, highest frequency, best noise control, highest density, greatest number of I/Os, smallest device footprints, and lowest profile.

The VLSI silicon technology and the integrated circuit design achieve a great progress. The integrated circuit chip sizes are continually shrinking, while circuit densities and I/O counts continue to increase. These trends require and drive the development of very high density I/O providing the interconnections in the integrated circuit modules. C4 solder bumps can form the solder joints that provide the high density interconnection between the chip and the substrate. This requires the very precise placement of each solder bump, uniform control of bump height as well as the very small space among solder bumps.

The solder bumps are fabricated directly on the metal pads that distribute on the surface of wafer. The pads are surrounded by the insulating and non-solderable layer with opening patterns. These pads connect with the integrated circuits in the wafer and are electrically isolated from each other. On the substrate (e.g. PCB or ceramic), flip chip attachment also requires the pads with the precise arrangement matching the solder bumps.

One method of forming solder bumps is introduced by IBM in the early 1960s. A metal mask with designed holes is placed over the wafer for depositing the solder bumps. The deposition process is performed in a vacuum chamber where the solder material is evaporated through the mask to deposit on the wafer. Due to the requirements of expensive equipments and complicated process control, the technique isn't used widely.

The electroplating-based flip chip process offers some advantages over other solder preparation methods. It is one of the most widely used methods. It is applicable to ultra-fine pitched I/Os, due to the accurate pattern transfer by the photolithographic process. This method is cheaper than the evaporation method because the expensive metal mask isn't needed and the plating process is simple. In comparison with other processes, the electroplating bumping process can achieve the solder material deposition on the fine-pitch I/O pads.

FIGS. 1a–1d show a known electroplating method of forming solder bumps on a wafer. Before the electroplating process, the metal pads 3 with designed patterns are deposited by chemical vapor deposition (CVD), plasma-enhanced chemical vapor deposition (PECVD), or physical vapor deposition (PVD) (sputtering or evaporation) on the wafer 1. A passivation layer 2, an insolating material with opening patterns, is deposited to cover the metal pads 3. The electroplating bumping process requires a continuous electrically conductive seed layer 6 that is deposited on the wafer 1, as shown in FIG. 1a. The seed layer 6 provides the electroplating current for the deposition of solder material 15 during the electroplating process.

In order to improve the adhesion and reliability of solder bumps, a few metal films consist in a multi-layer under bump metallization (UBM) layer 16, which also act as part of the seed layer 6. The UBM layer 16 usually includes the first adhesion layer using either chromium (Cr), or titanium tungsten alloy (Ti—W). And the second metal layer 16 in the UBM layer 16 comprises either copper, or chromium copper alloy (Cr—Cu). A very thin good (Au) film is formed to protect the second layer from the oxidation. After the UBM layer 16 deposition process, the thick photoresist 14 with the designed patterns is coated on the wafer 1, as shown in FIG. 1b. The patterned photoresist 14 will provide the mask for the deposition of solder materials 15.

After the electroplating process, the desired volume of solder material 15 forms a mushroom-shape on the wafer 1, as shown in FIG. 1c. And then the photoresist 14 is removed and the solder material 15 remains. Tin-lead alloys (Sn/Pb) with various compositions are usually used as well as lead-free alloys, for example, tin-silver, tin-copper, tin-silver-copper, etc. The solder materials 15 can form solder bumps 4 through a melting or reflowing process. The melting or reflowing temperature depends on the alloy compositions. Before the reflowing process, the seed layer 6 among the solder materials 15 needs to be removed. The seed layer 6 may cause the electrical short and the solder collapse during the reflowing process. A chemical or electrolytic etching process is performed to remove the seed layer 6 among the solder materials 15. During the reflowing process, the solder material 15 melts and forms the solder bumps 4, as shown in FIG. 1d.

The deposition of electroplated solder bump is determined by plating current density, temperature, electrolyte composition, additive and other process parameters. During the reflowing process, tin in the solder bumps 4 can react with the top metal of the UBM layer 16 to form an intermetallic compounds (IMC). The IMC layer can provide a mechanical bond between the solder bump 4 and the UBM layer 16. But the growth of thick IMC layer will degrade the reliability of solder bump 4 because the IMC layer is a brittle material and it can consume the UBM layer 16. The solder bumping process affects the growth of IMC and the thermal fatigue life of solder joints. Furthermore, the IMC layer thickens during device long-time storage and device operations even at room temperature. Under some loading conditions, cracks initiate and propagate easily at the interface of the solder and IMC layers resulting in mechanical failure of the joints.

The photoresist process is also an important factor. The reliability and the height uniformity of solder bumps are affected by the photolithography process. The thickness of photoresist 14 should reach an appropriate thickness to realize solder bumps 4 with required height. Low photoresist thickness during the electroplating process can cause bridging. The typical photolithography cannot achieve enough thick photoresist film to avoid the bridging between both of solders. And the pattern holes with straight vertical wall are provided by the costly and complex photoresist process.

After the electroplating process, the conventional UBM etching process removes some solder to affect the uniformity and quality of bumps. And the residue of etching process causes the bridging of solder bumps, specially, for the fine-pitch solder bumps. Therefore, it is necessary to invent a simple and low-cost solder bumping process.

SUMMARY OF THE INVENTION

In accordance with the present invention, an improved method of forming solder bumps for flip chip are described and illustrated. The present invention introduces a thin film including its characteristics, design, and manufacturing method. The thin film is called as Bump-Reflow-Control (BRC) Layer in the present invention. The material characteristics of BRC layer is any kind of thin film material that the solder cannot adhere and bond to the surface of BRC layer during the reflowing process. The present patent also provides a method of design and manufacturing for an improved structure of the UBM layer that consists of the BRC layer and a few metal layers with designed patterns. The improved UBM layer including the BRC layer can improve the formation of solder bumps.

According to a first embodiment of the present invention, the BRC and the improved UBM layer are defined and patterned by the photolithography process and the lift-off process. A series of photolithography masks are designed according to the process requirements. A Ni—Ti, Ni—V, or Ti—W, Cr layer is deposited and patterned on the wafer surface. And a Cu, Cu—Ni, or Cu—Cr layer is deposited to form a seed layer on the first layer. The BRC layer is then prepared on the surface of the second layer. The BRC material may be a kind of metal, such as for example, Ti, W, Ti—W alloy, Al, Al—Si alloy, etc. The BRC material is also a kind of organic or composite thin film, such as for example, polyimide, epoxy, BCB, SiO2, Si3N4, etc. The BRC layer can be deposited by a kind of thin film preparation process, for example, sputtering, evaporation process, PECVD, etc. After the electroplating solder bump process, the solder material is then reflowed to form the bump. The solder materials don't collapse on the surface of wafers during the reflow process because of the BRC layer. After the reflowing process, the BRC layer and the seed layer will be removed by an etching or electrolytic process. This process is controlled easily without removing the solder and remaining the residue because the solder material has formed the hard solder bump.

According to the present invention, a method of forming low-cost and simpler thick photoresist is described and illustrated including a series of photolithography processes, a relevant part design and manufacturing, and a few relevant mask designs.

In accordance with the last embodiment of the present invention, a mechanical part designed with a hermetic cover 7 is described and illustrated as shown in FIG. 2. It is used to improve the photoresist process. The function of cover 7 is to eliminate the relative air flow between the space 8 air and the wafer 1. During the spin coating of the photoresist, the wafer 1 is put into the part. A vacuum system path is fabricated in the substrate 17 in FIG. 2. The wafer will be held by the vacuum system when the part spins at a high speed. The spinning speed will increase step by step. The distance between the wafer and the cover is from 3 mm to 10 mm. The part's hermetical structure can keep the solvent in the photoresist from evaporating.

DETAILED DESCRIPTION OF THE PREFERRED EMBODIMENT

According to the present invention, an application demonstration is described using some relevant materials. The detailed processes, method and designs are illustrated according to the drawings.

Figure 3A:
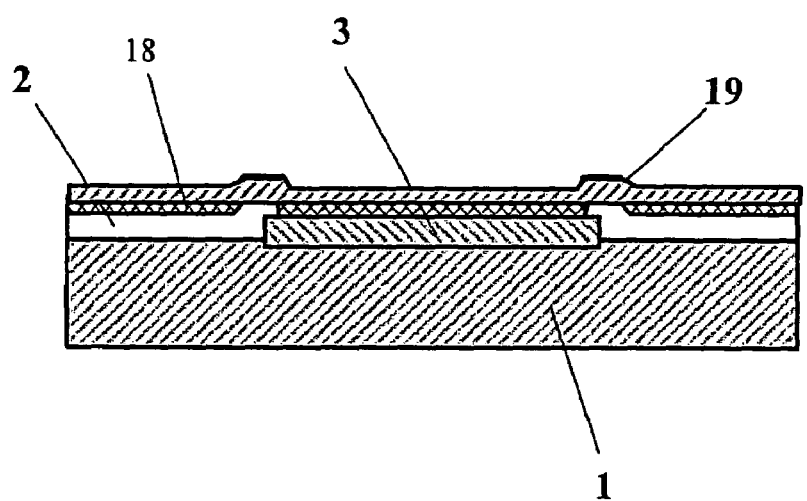
FIGS. 3a–3c illustrate a method of forming the improved UBM structures and BRC layer.
Figure 3B:
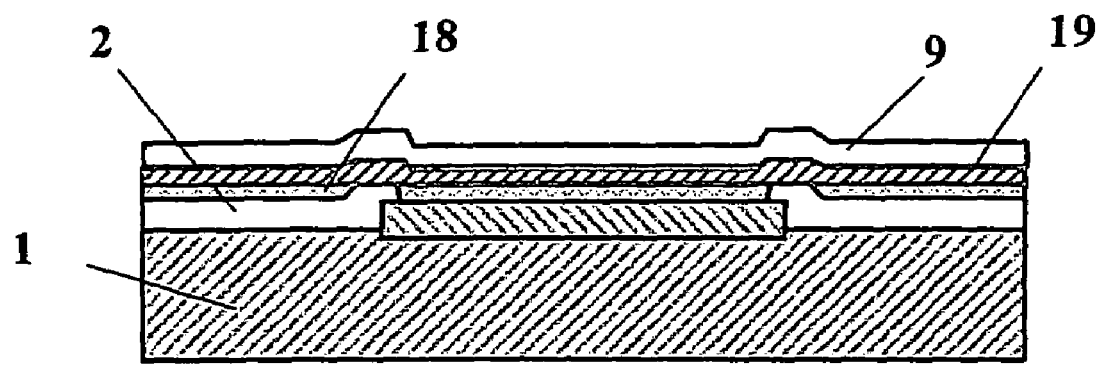
Figure 3C:
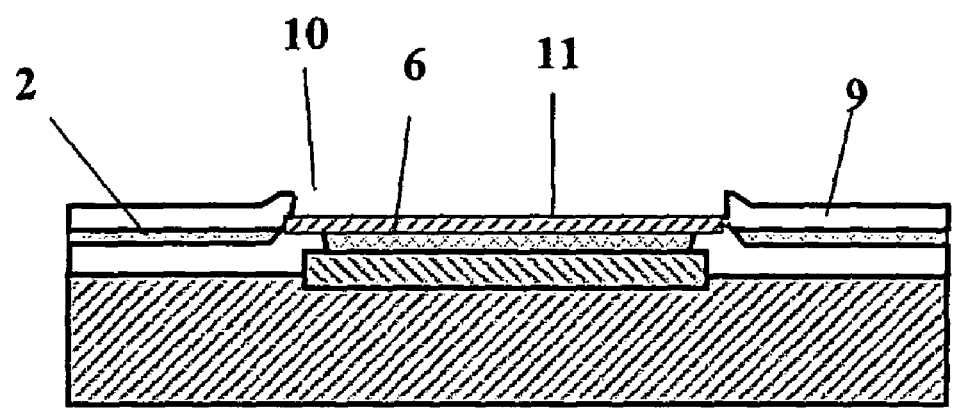

FIGS. 3a–3c illustrate a method of forming the improved UBM structures and BRC layer. FIG. 3a shows the interconnection metal 3 and the passivation layer 2 have deposited on the wafer 1. A Ti—W alloy layer 18 is deposited by the sputtering process on the wafer 1 firstly. The thickness of Ti—W alloy is between 50 nm and 120 nm. A Cu layer 19 is then deposited on the layer 18. The thickness of layer 19 is between 200 nm and 600 nm. Both of layers are prepared in vacuum system at the same time. And then the organic BRC layer is prepared using a photo-sensitive polyimide. The polyimide layer 9 is coated by the spinning process on the wafer, as shown in FIG. 3b. A thickness of formed thin film 9 is less than 150 nm. The polyimide layer 9 is exposed and patterned by the photolithography process. The metal layer 19 should be exposed. The diameter of pattern opening 10 is 10%~35% more than the diameter of passivation pattern opening 11, as shown in FIG. 3c. The selected polyimide material should outstand the temperature of reflowing process. After the reflow process, the polyimide can be removed. In FIG. 3c, the diameter of passivation pattern opening 11 is 80 microns, and the diameter of polyimide opening 10 is 110 microns.

Figure 4A:
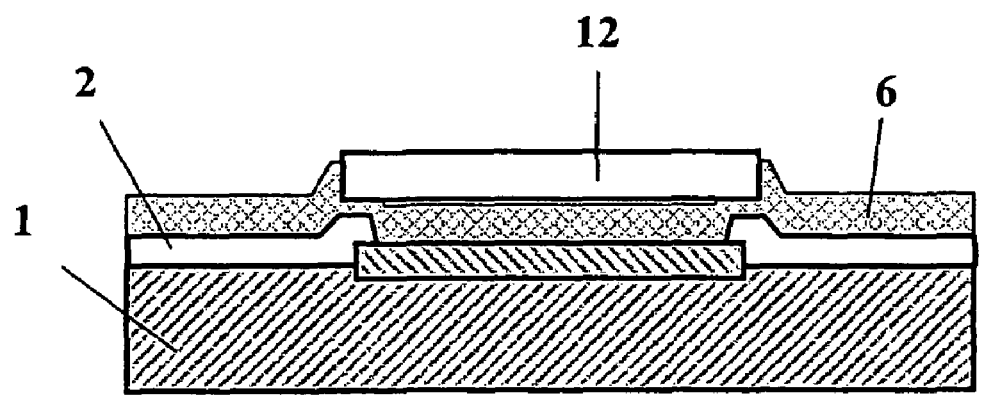
FIGS. 4a–4c illustrate alternate method of forming BRC layer 13 using metal layer and lift-off process.
Figure 4B:
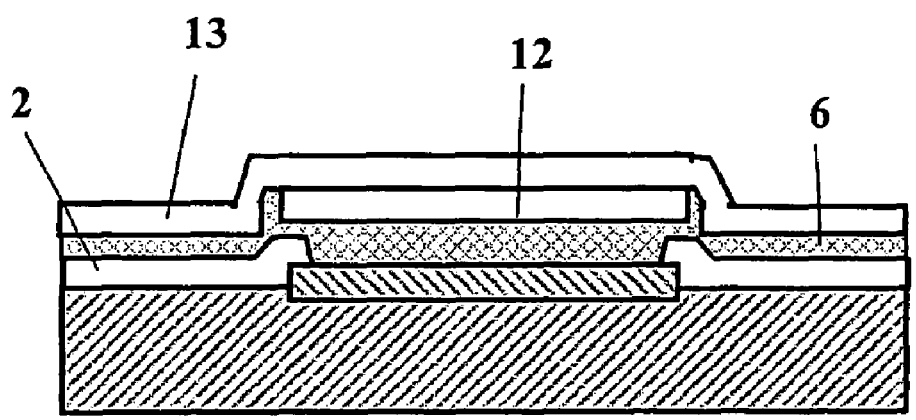
Figure 4C:
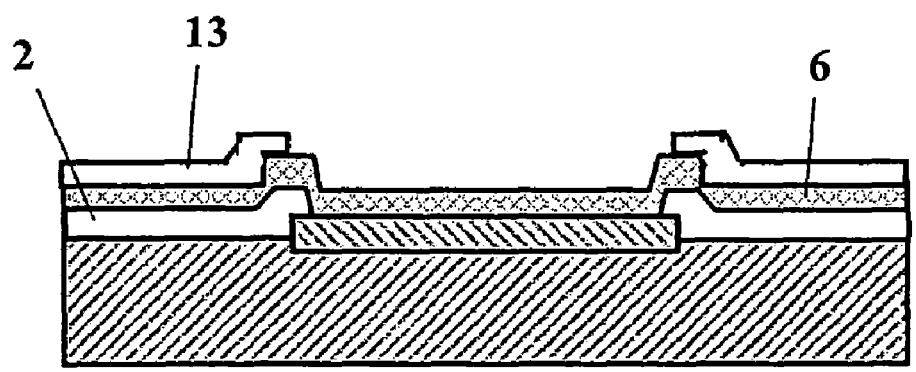

FIGS. 4a–4c illustrate alternate method of forming BRC layer 13 using metal layer and lift-off process. Firstly, the photoresist 12 is deposited and patterned on the wafer 1, as shown in FIG. 4a. The photoresist mask is fabricated according to the dimension of BRC layer 13 opening patterns. A Ti—W layer 13 is deposited on the wafer 1 and photoresist 12. The thickness of layer 13 is between 30 nm and 50 mn, as shown in FIG. 4b. The photoresist is then removed to form the desired patterns of the BRC layer 13. The diameter of Ti—W layer 13 is 110 microns, as shown in FIG. 4c.

Figure 1A:
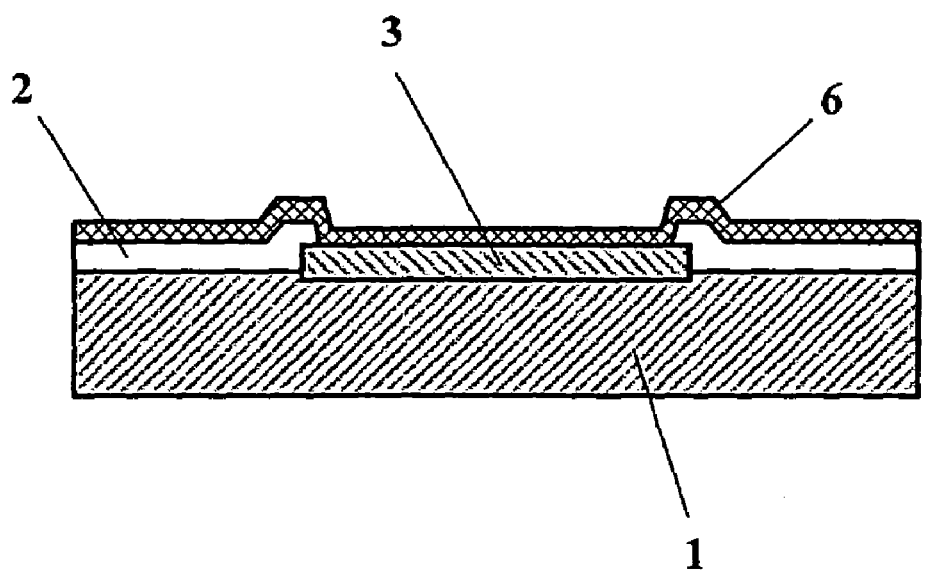
FIGS. 1a–1d illustrate a known formation process of solder bumps for flip chip.
Figure 1B:
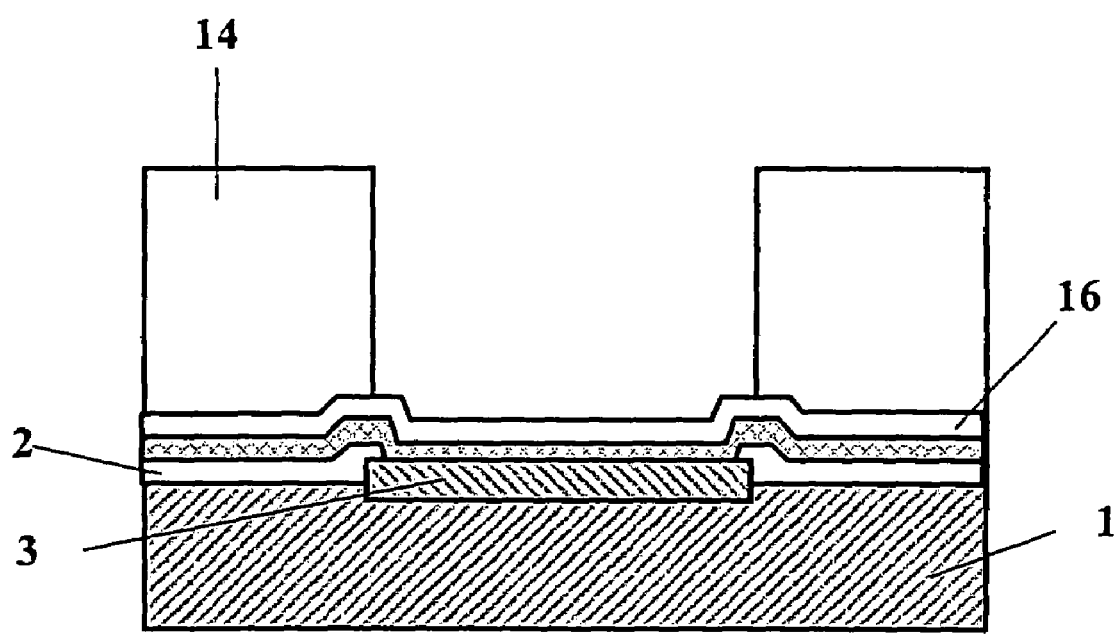
Figure 1C:
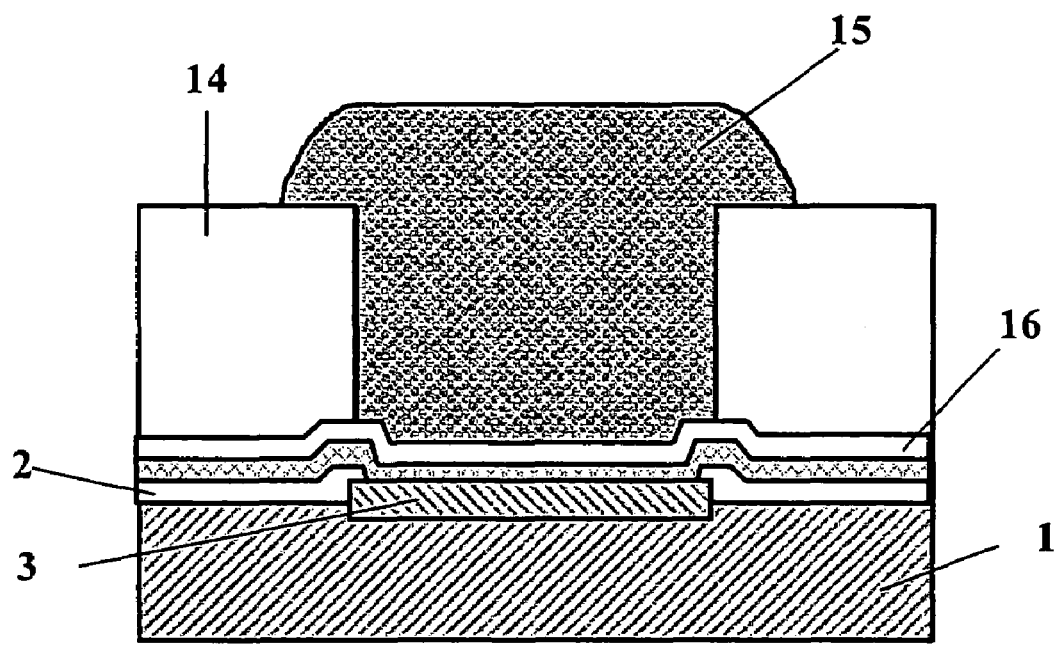
Figure 1D:
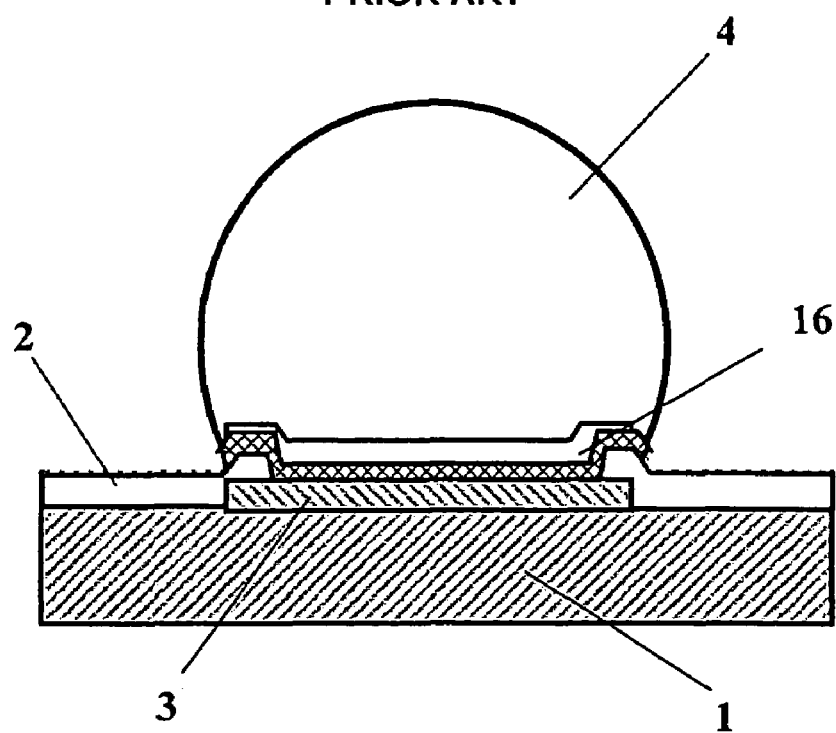
Figure 2:
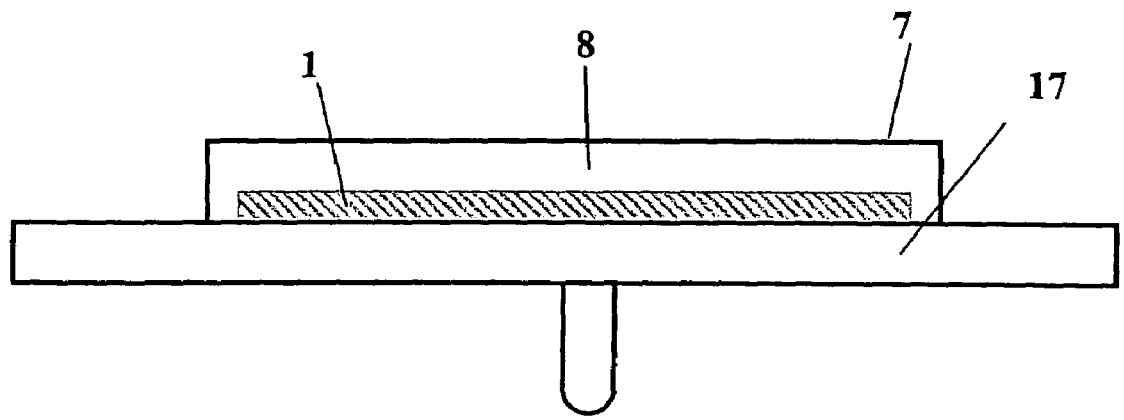
FIG. 2 illustrates the cross-sectional view and design of a hermetic cover used during the photoresist coating.
Figure 5:
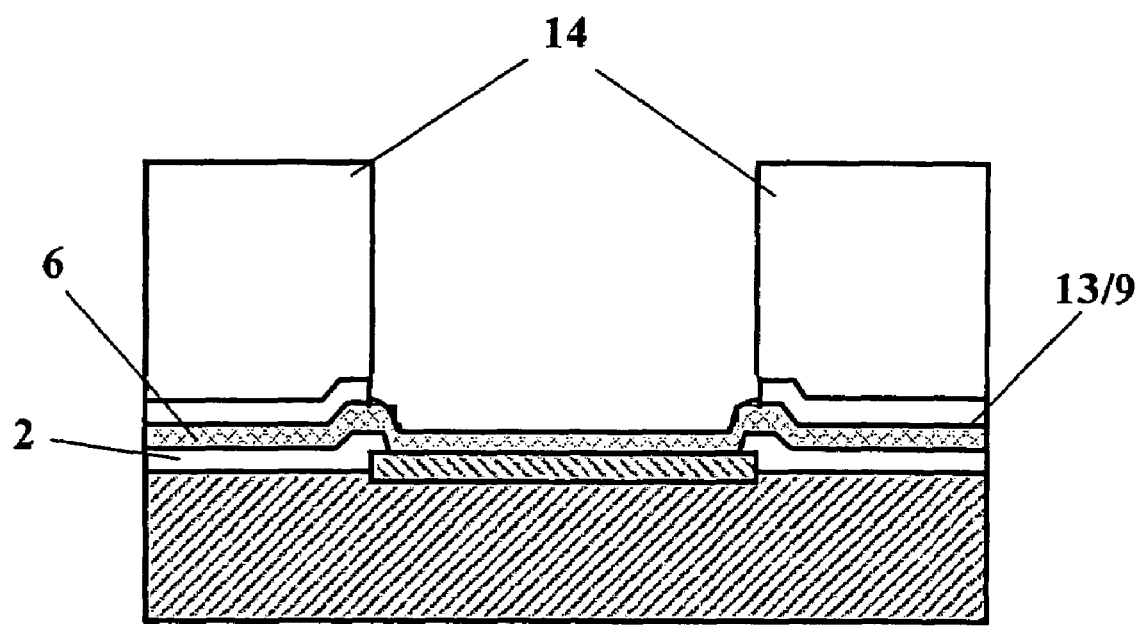
FIG. 5 shows the cross-sectional view of photoresist 14 after the photolithography.

After the fabrication of the BRC layer, the thick photoresist is deposited on the wafer 1. In order to reach the desired thickness, the photoresist spin-coating process is performed using the part designed in FIG. 2. After the coating process, FIG. 5 shows the cross-sectional view of photoresist 14 after the exposure, developing and hard bake process.

A series of processes of photolithography process is described in the present invention instead of typical process. 1) The pre-soft bake process is performed using a hot plate at 45° C.~60° C. for 4~10 min. 2) The wafer stay at a environment of 20° C.~25° C. for 20~25 min. 3) The soft bake is performed at 110° C. 4) The exposure and development process is finished. 5) The hard bake is at 50° C. on the hot plate for 45 min. The special process can avoid the voids and defects generated during the photoresist process so that the uniform and good quality of solder bumps are obtained.

Figure 6A:
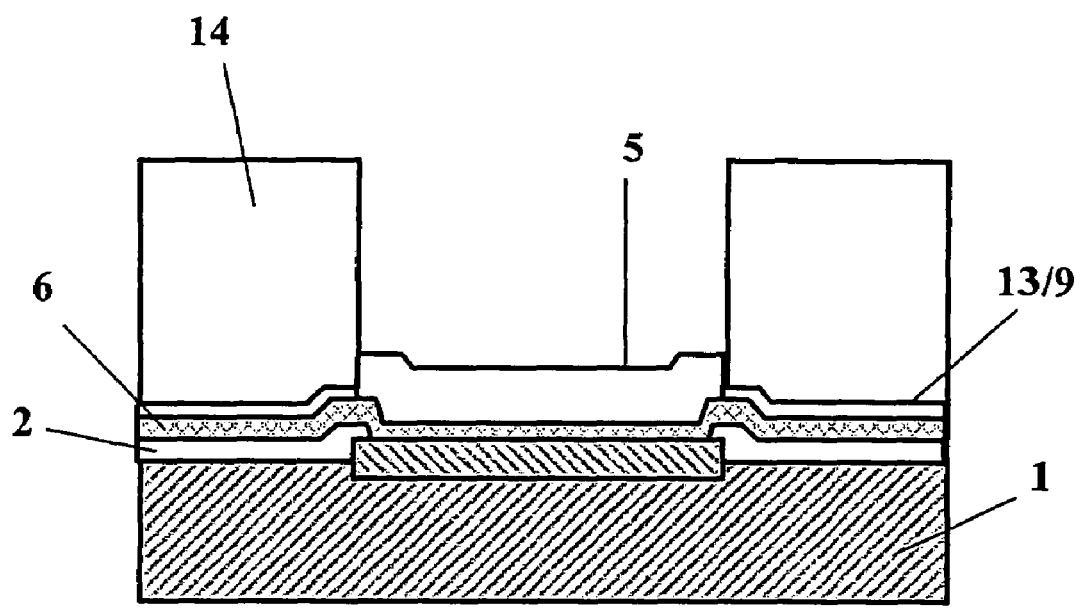
FIGS. 6a–6b illustrate the electroplating process.
Figure 6B:
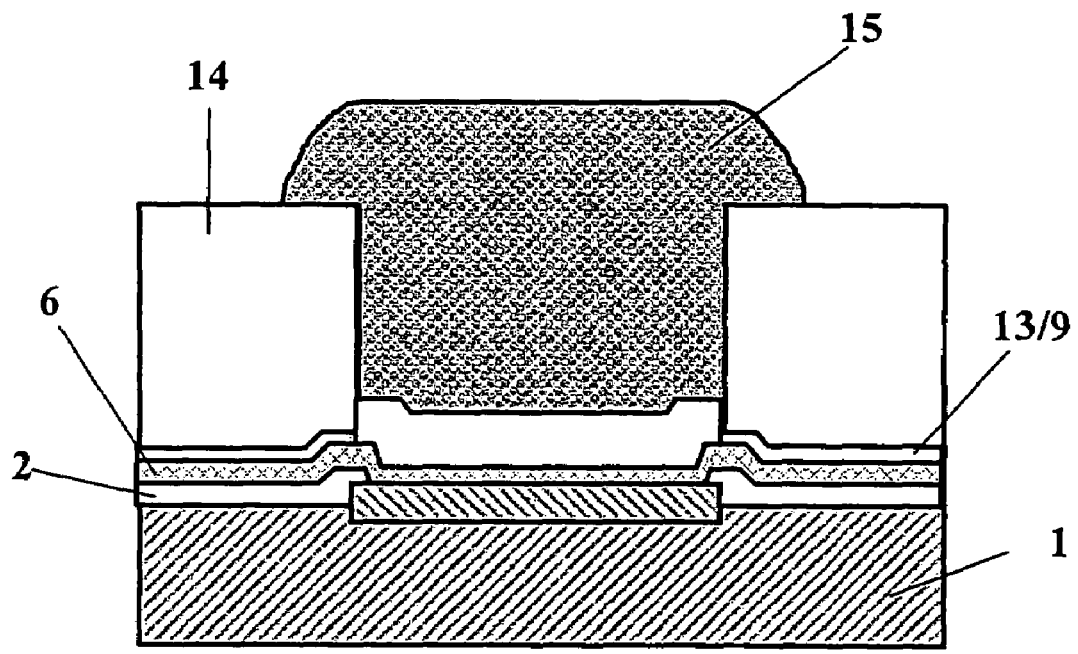

FIGS. 6a–6b illustrate the electroplating process. The Cu stud is deposited by an optimal electroplating parameter. The thick photoresist defines the patterns of Cu studs. The grain size of Cu stud is controlled less than 2 microns to achieve a smooth surface morphology. The surface roughness is less than 500 nm. It can reduce the Intermetallic compounds that degrade the reliability of solder bumps. The Cu stud thickness is between 5 microns and 25 microns. And then the solder materials 15 are deposited by the electroplating process and form the mushroom shaped bumps like FIG. 6b.

Figure 7A:
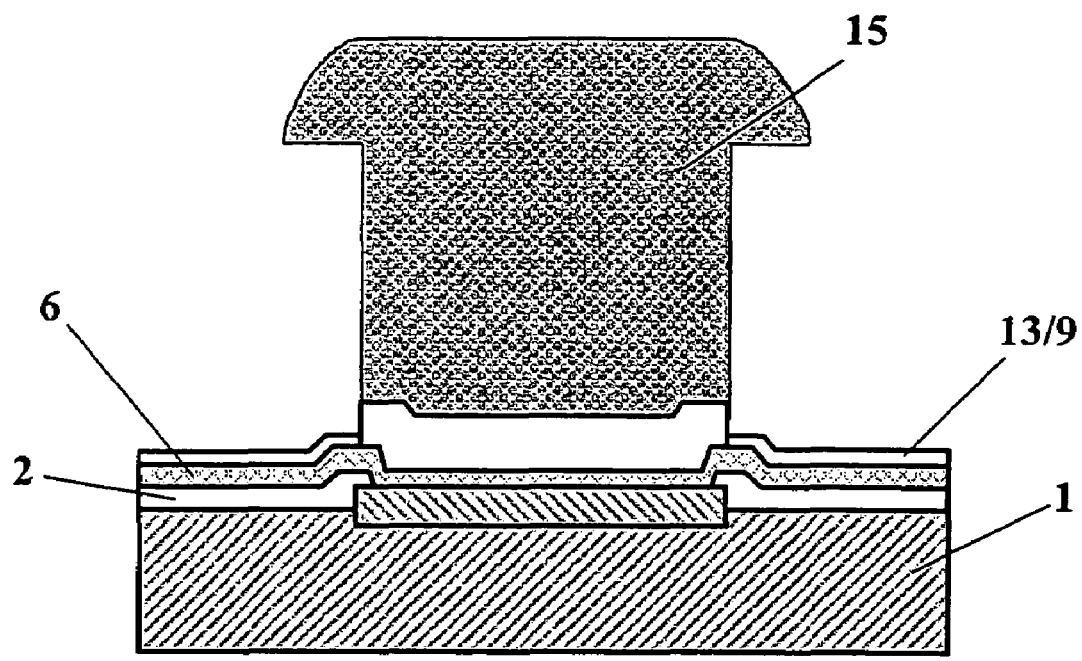
FIGS. 7a–7d illustrate the BRC layer 13 function and its etching process after the reflowing process.
Figure 7B:
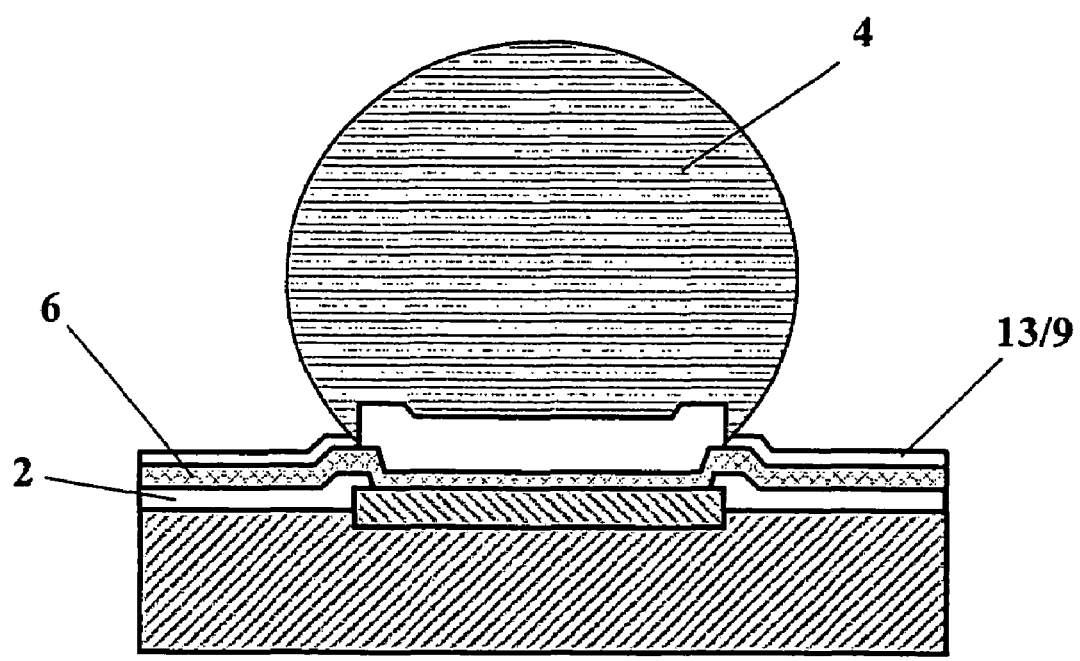
Figure 7C:
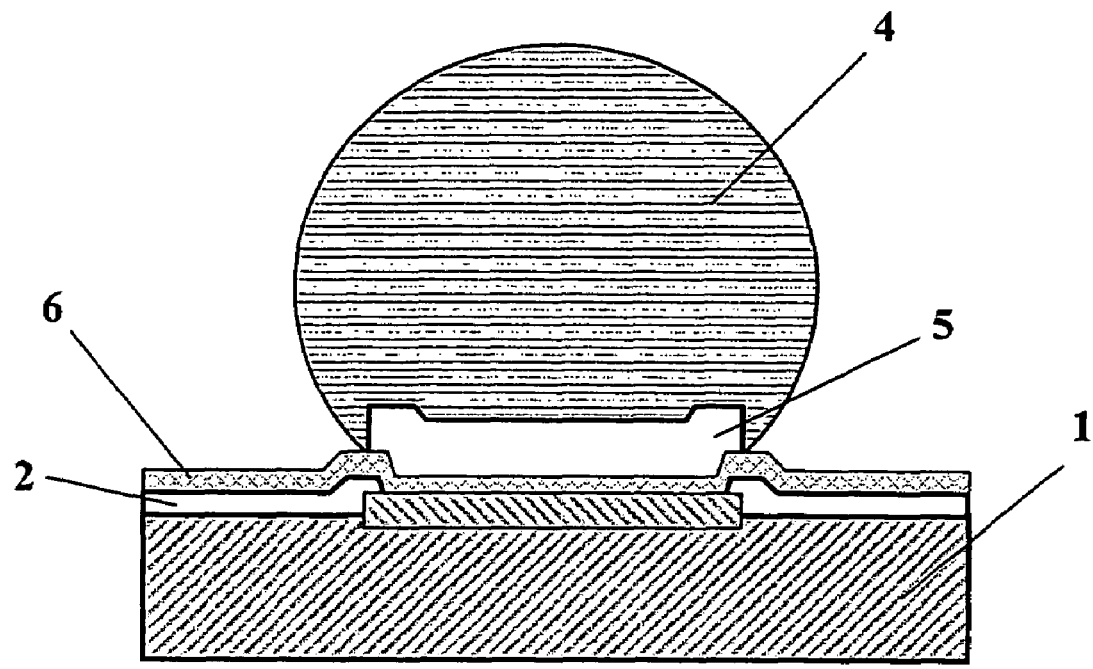
Figure 7D:
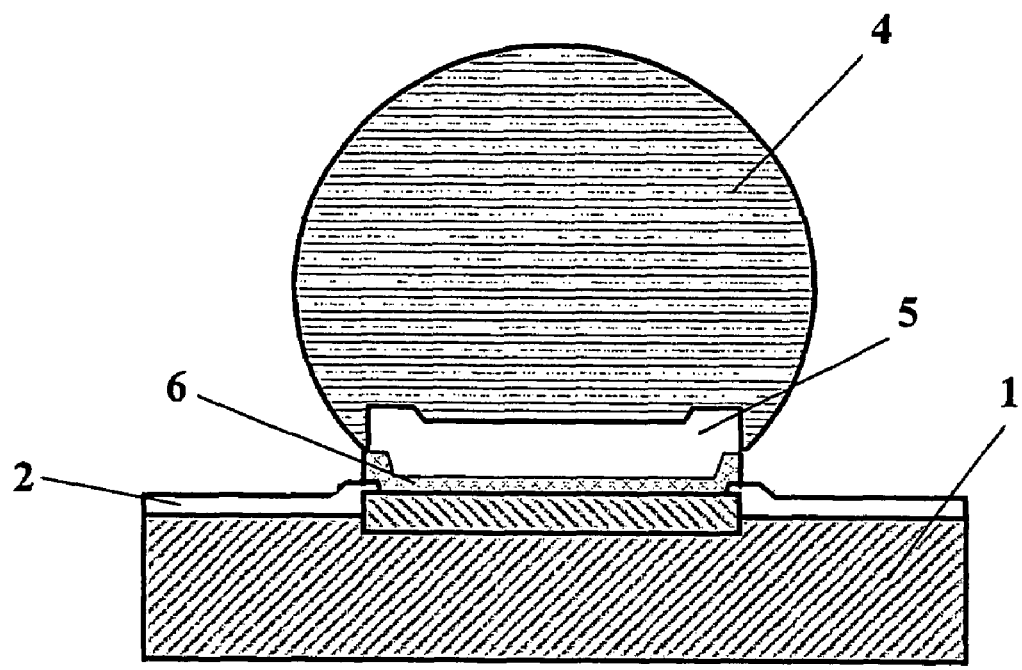

FIGS. 7a–7d illustrate the BRC layer 13 function and its etching process after the reflowing process. After the plating process, the photoresist 14 is removed, as shown in FIG. 7a. The reflow process is then carried out directly. Because the BRC layer 13 exists, the solder balls 4 can form instead of collapsing on the wafer like FIG. 7b. The BRC layer 13 can improve the quality of solder bumps 4 to prevent from the bridging issue even if the pad pitch is very small. The opening size of photoresist designed is larger than the opening pattern size of BRC layer. The solder material enough can be provided so as to form the desired height of solder ball. After the reflow process, the BRC layer 13 and the plating seed layer 6 are removed as shown in FIGS. 7c–7d. These layers are also etched easily because the shrinking solder cannot affect the etching process. The solder bumps reflowed are hard enough. The etching process cannot move the solder bumps 4 to degrade its reliability.

What is claimed is:

1. A method of forming solder bumps for a flip chip on a wafer or substrate with semiconductor devices, the method comprising:

forming a first continuous electrically conductive metal layer on bond pads of an integrated circuit wafer or a semiconductor substrate;

forming a thin film called a Bump-Reflow-Control (BRC) Layer overlying said first metal layer;

forming a desired pattern on said BRC layer to expose said first metal layer on said bond pads;

forming a thick photoresist film with designed holes on said BRC layer using a hermetic cover and a photolithography process;

after forming the photoresist film, forming a metal stud and solder material through an electroplating process at said designed holes of thick photoresist film wherein the metal stud and solder material are formed on a surface of said first metal layer;

reflowing said solder material to form said solder bumps; and after reflowing said solder material removing said BRC layer and then etching said first metal layer among said solder bumps.

2. The method according to claim 1, wherein said bump reflow control layer is formed of a thin film that the solder cannot adhere and bond to its surface during the reflowing process.

3. The method according to claim 1, wherein said BRC layer is applied by photolithography process and lift-off process.

4. The method according to claim 1, wherein said desired pattern opening size of said BRC layer is 10%~35% more than the pattern opening size of a passivation layer in a mask design for said thick photoresist layer.

5. The method according to claim 2, wherein said thin film thickness is between 10 nm and 1500 nm.

6. The method according to claim 2, wherein said thin film is an organic material that the solder cannot adhere and bond to its surface during the reflowing process.

7. The method according to claim 6, wherein said organic material is formed of a polyimide, epoxy, or BCB.

8. The method according to claim 6, wherein said thin film is applied by a spin-casting process comprising the steps of: forming a thin film by the spin-coating process; and forming the designed pattern opening on said thin film through photolithography process.

9. The method according to claim 2, wherein said thin film is formed of any kind of metal material that the solder cannot adhere and bond to its surface during the reflowing process.

10. The method according to claim 9, wherein said metal material is formed of Titanium, Titanium Tungsten alloy, Aluminum, Aluminum Silicon composite, Aluminum Titanium alloy, or Palladium.

11. The method according to claim 9, wherein said metal material is applied by a lift-off process comprising the steps of: firstly, forming a photoresist film with designed patterns; forming metal thin film on said photoresist film wherein the thickness of said metal film is between 10 nm and 50 nm; and removing the photoresist film to form the desired patterns on said BRC layer.

12. The method according to claim 9, wherein said metal layer is applied by chemical vapor deposition.

13. The method according to claim 9, wherein said metal layer is applied by physical vapor deposition.

14. The method according to claim 9, wherein said metal layer is applied by E-beam deposition process.

15. The method according to claim 1, wherein said first continuous electrically conductive metal layer is formed of a first sub-layer and a second sub-layer overlying said first sub-layer.

16. The method according to claim 1, wherein said first continuous electrically conductive metal layer is between 30 and 800 nm thick.

17. The method according to claim 1, wherein said first continuous electrically conductive metal layer is a thin film not causing microstructure mismatch and providing a good adhesion with said BRC layer.

18. The method according to claim 15, wherein said first sub-layer is formed of Titanium, Titanium Tungsten alloy, Nickel Titanium, Nickel, Nickel Vanadium alloy, Silver, or Nickel Silver alloy.

19. The method according to claim 15, wherein said second sub-layer is formed of Copper, Copper Chromium alloy, Copper Nickel alloy, or Gold.

20. The method according to claim 1, wherein said thick photoresist film is more than 50 microns thick and is patterned by a mask.

21. The method according to claim 1, wherein the pattern opening size of said thick photoresist film is 3~7% less than pattern opening size of said BRC layer.

22. The method according to claim 1, wherein said hermetic part is formed of metal and eliminates the relative air flow between said wafer and the air on said wafer surface, the function of said hermetic part is to keep the solvent in the photoresist from the evaporation, and the distance between said wafer and said hermetic cover is from 3 mm to 10 mm.

23. The method according to claim 1, wherein said special photolithography process comprises the steps of: 1) performing a pre-soft bake process using a hot plate at 45° C.~60° C. for 4~10 min.; 2) subjecting a wafer to an environment of 20° C.~25° C. for 20~25 min.; 3) performed at 110° C.; 4) finishing the exposure and development process; and 5) performing a hard bake at 50° C. on the plate for 45 min.

24. A method of forming solder bumps for a flip chip on a wafer or substrate with semiconductor devices, the method comprising:
    forming a first continuous electrically conductive metal layer on bond pads of an integrated circuit wafer or a semiconductor substrate;
    forming a Bump-Reflow-Control (BRC) Layer overlying said first metal layer;
    removing a portion of the BRC layer to form an opening therein to expose a portion of said first metal layer on said bond pads;
    forming a homogeneous thick photoresist film with a predetermined opening wherein the portion of the first metal layer is exposed through the predetermined opening in the thick photoresist film;
    forming a metal stud and solder material through an electroplating process directly on the portion of the first metal layer through the predetermined opening in the photoresist film; and
    reflowing said solder material to form said solder bumps; and
    after reflowing said solder material removing said BRC layer and then etching said first metal layer among said solder bumps.

25. The method of claim 24, wherein the forming of only one thick photoresist film includes using a hermetic cover and a photolithography process.

26. A method of forming solder bumps for a flip chip on a wafer or substrate with semiconductor devices, the method comprising:
    forming a first continuous electrically conductive metal layer on bond pads of an integrated circuit wafer or a semiconductor substrate;
    forming a thin film called a Bump-Reflow-Control (BRC) Layer overlying said first metal layer;
    forming a desired pattern on said BRC layer to expose said first metal layer on said bond pads;
    forming a thick photoresist film with designed holes on said BRC layer;
    forming a metal stud and solder material through an electroplating process at said designed holes of the thick photoresist film;
    reflowing said solder material to form said solder bumps; and
    after the reflowing step, removing said BRC layer and then etching said first metal layer among said solder bumps.

27. the method of claim 26, wherein the forming of a thick photoresist film includes using a hermetic cover and a photolithography process.

28. A method of forming solder bumps for a flip chip on a wafer or substrate with semiconductor devices, the method comprising:
    forming a first continuous electrically conductive metal layer on bond pads of an integrated circuit wafer or a semiconductor substrate;
    forming a Bump-Reflow-Control (BRC) Layer overlying said first metal layer;
    removing a portion of the BRC to form an opening therein to expose a portion of said first metal layer on said bond pads;
    after exposing the portion of the first metal layer, forming a photoresist film with a predetermined opening in said BRC layer using a hermetic cover and a photolithography process wherein the portion of the first metal layer is exposed through the predetermined opening in the thick photoresist film;
    after forming the photoresist film, forming a metal stud and solder material through an electroplating process directly on the portion of the first metal layer through the predetermined opening in the thick photoresist film;
    reflowing said solder material to form said solder bumps; and
    after reflowing said solder material removing said BRC layer and then etching said first metal layer among said solder bumps.

* * * * *